(12) United States Patent
Kim

(10) Patent No.: US 9,811,217 B2
(45) Date of Patent: Nov. 7, 2017

(54) TOUCH PANEL

(71) Applicant: LG INNOTEK CO., LTD., Seoul (KR)

(72) Inventor: Byeong Seob Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 295 days.

(21) Appl. No.: 14/448,354

(22) Filed: Jul. 31, 2014

(65) Prior Publication Data

US 2015/0114816 A1    Apr. 30, 2015

(30) Foreign Application Priority Data

Oct. 24, 2013  (KR) .......................... 10-2013-0127213

(51) Int. Cl.
*G06F 3/044* (2006.01)
*H03K 17/96* (2006.01)

(52) U.S. Cl.
CPC ........... *G06F 3/044* (2013.01); *H03K 17/962* (2013.01); *G06F 2203/04103* (2013.01); *G06F 2203/04111* (2013.01); *H03K 2017/9615* (2013.01); *H03K 2217/96075* (2013.01); *H03K 2217/960755* (2013.01)

(58) Field of Classification Search
CPC .................................................. G06F 3/044
See application file for complete search history.

(56) References Cited

U.S. PATENT DOCUMENTS

| | | | | |
|---|---|---|---|---|
| 6,488,981 B1 * | 12/2002 | Richter | ................... | G06F 3/041 204/192.1 |
| 8,872,786 B2 * | 10/2014 | Matsuo | ................... | G06F 3/044 345/174 |
| 2007/0242054 A1 * | 10/2007 | Chang | ................... | G06F 3/044 345/173 |
| 2008/0309635 A1 * | 12/2008 | Matsuo | ................... | G06F 3/044 345/173 |
| 2010/0231542 A1 | 9/2010 | Momose | | |
| 2011/0234526 A1 * | 9/2011 | Mi | ......................... | H05K 3/30 345/174 |
| 2011/0291987 A1 * | 12/2011 | Wang | ..................... | G06F 3/044 345/174 |

(Continued)

FOREIGN PATENT DOCUMENTS

| | | | | |
|---|---|---|---|---|
| CN | WO 2013023482 A1 * | 2/2013 | ............. | G06F 3/044 |
| TW | 201219905 A | 5/2012 | | |

(Continued)

OTHER PUBLICATIONS

Office Action dated Jun. 22, 2015 in Taiwanese Application No. 103119010.

(Continued)

*Primary Examiner* — Dorothy Harris
(74) *Attorney, Agent, or Firm* — Saliwanchik, Lloyd & Eisenschenk

(57) ABSTRACT

Disclosed is a touch panel. The touch panel includes a cover substrate including an active area and an inactive area; a first printing layer on the inactive area; and first and second conductive layers on the first printing layer, wherein the first and second conductive layers extend from a side surface of the first printing layer along a top surface of the first printing layer.

19 Claims, 8 Drawing Sheets

(56) References Cited

U.S. PATENT DOCUMENTS

| | | | |
|---|---|---|---|
| 2012/0062481 A1 | 3/2012 | Kim et al. | |
| 2012/0113043 A1* | 5/2012 | Liu | G06F 3/044 345/174 |
| 2013/0082961 A1* | 4/2013 | Wang | G06F 3/044 345/173 |
| 2013/0241857 A1* | 9/2013 | Chung | G06F 3/041 345/173 |
| 2014/0079917 A1* | 3/2014 | Huang | B32B 38/145 428/189 |
| 2014/0182888 A1 | 7/2014 | Chuang et al. | |
| 2015/0041303 A1* | 2/2015 | Cao | G06F 3/044 200/600 |
| 2015/0084917 A1* | 3/2015 | Kim | G06F 3/044 345/174 |
| 2015/0085204 A1* | 3/2015 | Lee | G06F 3/041 349/12 |
| 2015/0130760 A1* | 5/2015 | Kim | G06F 3/044 345/174 |
| 2015/0169109 A1* | 6/2015 | Park | G06F 3/044 345/174 |
| 2015/0177882 A1* | 6/2015 | Kim | G06F 3/044 345/174 |
| 2015/0223324 A1* | 8/2015 | Kim | H05K 1/0259 345/174 |
| 2015/0301685 A1* | 10/2015 | Kim | G06F 3/041 345/173 |
| 2015/0373839 A1* | 12/2015 | Kim | H05K 1/0274 345/174 |
| 2016/0034066 A1* | 2/2016 | Nah | G06F 3/044 345/174 |

FOREIGN PATENT DOCUMENTS

| | | |
|---|---|---|
| TW | M456541 U1 | 7/2013 |
| TW | M461098 U | 9/2013 |
| TW | 201340185 A | 10/2013 |
| WO | WO-2013143397 A1 | 10/2013 |

OTHER PUBLICATIONS

European Search Report dated May 11, 2015 in European Application No. 14170692.9.

\* cited by examiner

TOUCH PANEL

CROSS-REFERENCES TO RELATED APPLICATION

This application claims the benefit under 35 U.S.C. §119 of Korean Patent Application No. 10-2013-0127213, filed Oct. 24, 2013, which is hereby incorporated by reference in its entirety.

BACKGROUND

Technical Field

The embodiment relates to a touch panel.

Recently, a touch panel, which performs an input function through the touch of an image displayed on a display by an input device such as a stylus pen or a hand, has been applied to various electronic appliances.

The touch panel may be mainly classified into a resistive touch panel and a capacitive touch panel. In the resistive touch panel, glass is shorted with an electrode due to the pressure of the input device so that a touch point is detected. In the capacitive touch panel, the variation in capacitance between electrodes is detected when a finger of the user is touched on the capacitive touch panel, so that the touch point is detected.

In the resistive type touch panel, the repeated use thereof may degrade the performance thereof, and cause scratches. Accordingly, the interest in the capacitive type touch panel representing superior endurance and having a long lifespan is increased.

The touch panel may be provided in various types according to the position at which a transparent electrode is formed. For example, the transparent electrode may be directly formed on a cover substrate.

In this case, a printing layer is formed in a bezel area where a touch is not sensed, and a wire electrode is formed on the printing layer. The wire electrode may be connected to the sensing electrode and the pad part where a touch is sensed.

In this case, as the printing layer is formed in two layers or more, a step difference may be formed between the printing layers or the printing layer and the cover substrate. The wire electrode may be formed on the printing layer having the step difference. Thus, due to the step difference, crack may be generated in the wire electrode, so that the reliability may be deteriorated.

Therefore, there is required a novel structure of a touch panel capable of overcoming the above-described disadvantage.

BRIEF SUMMARY

The embodiment provides a novel structure of a touch panel having improved reliability.

According to the embodiment, there is provided a touch panel including a cover substrate including an active area and an inactive area; a first printing layer on the inactive area; and first and second conductive layers on the first printing layer, wherein the first and second conductive layers extend from a side surface of the first printing layer along a top surface of the first printing layer.

According to the touch panel of the embodiment, in order to solve a problem caused by a step difference in the printing layer formed on the inactive area of the cover substrate, a conductive layer and/or an insulating layer are formed on a printing layer to compensate for the step difference.

That is, the conductive layer formed on the step difference part of the printing layer is formed in two layers or more, so that, since an electric signal is enabled to be transmitted through another conductive material even if crack is generated in a conductive material of the step difference part at which the sensing electrode is connected to the wire electrode, an open circuit can be prevented.

In addition, the insulating material is formed on the step difference part by the first and second printing layers, so that the height of the step difference part by the first and second printing layers may be reduced, thereby preventing crack from being generated in the wire electrode due to the step difference.

Therefore, the touch panel according to the embodiment can prevent the cracks of the wire electrode and the connecting part from being generated due to the step difference of the printing layer.

DETAILED DESCRIPTION

Figure 1:
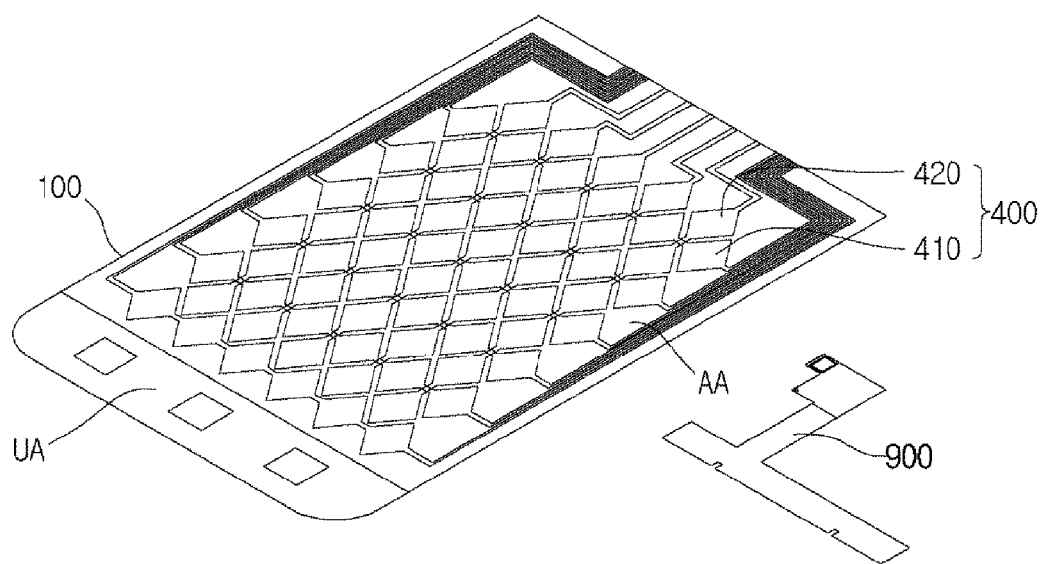
FIG. 1 is a perspective view showing a touch panel according to the first and second embodiments.

In the following description of the embodiments, it will be understood that, when a layer (or film), an area, a pattern, or a structure is referred to as being "on" or "under" another substrate, another layer (or film), another area, another pad, or another pattern, it can be "directly" or "indirectly" on the other substrate, layer (or film), area, pad, or pattern, or one or more intervening layers may also be present. Such a position of the layer has been described with reference to the drawings.

Hereinafter, the embodiment will be described with reference to accompanying drawings.

Touch panels according to the first and second embodiments will be described with reference to FIGS. 1 to 5.

Referring to FIGS. 1 to 5, each of touch panels according to first and second embodiments may include a cover substrate 100. The cover substrate 100 may include an active area AA and an inactive area UA. A bridge electrode 200, an insulating material 300 and a sensing electrode 400 may be provided on the active area AA of the cover substrate 100. A printing layer 500 and a wire electrode 600 provided on the printing layer 500 may be provided on the inactive area UA of the cover substrate 100.

The cover substrate 100 may include glass or plastic. For example, the cover substrate 100 may include tempered glass, half-tempered glass, sodalime glass, reinforced plastic, or flexible plastic.

The cover substrate 100 may include an active area AA and the inactive area UA. The active area AA refers to an area through which a touch instruction may be input by a user. To the contrary to the active area AA, the inactive area UA refers to an area through which the touch instruction is not input because the inactive area UA is not activated even if the user touches the inactive area UA.

The sensing electrode 400 including a conductive material is provided in the active area AA to enable a touch instruction to be input therethrough, and the printing layer 500 and the wire electrode 600 are provided in the inactive area UA.

An electrode is provided in the active area AA of the cover substrate 100. In detail, the bridge electrode 200 and the sensing electrode 400 may be provided on the active area AA.

The bridge electrode 200 and the sensing electrode 400 may include a transparent conductive material. For example, the bridge electrode 200 and the sensing electrode 400 may include a transparent conductive material such as indium zinc oxide (IZO) or indium tin oxide (ITO). The bridge electrode 200 and the sensing electrode 400 may include the same material or mutually different materials.

The bridge electrode 200 may be provided, for example, in a bar shape. In detail, the bridge electrodes 200 may be spaced apart from each other by a predetermined interval while being provided in the bar shape. The bridge electrode 200 may serve as a connecting electrode for connecting first sensing electrodes described below to each other.

Figure 2:
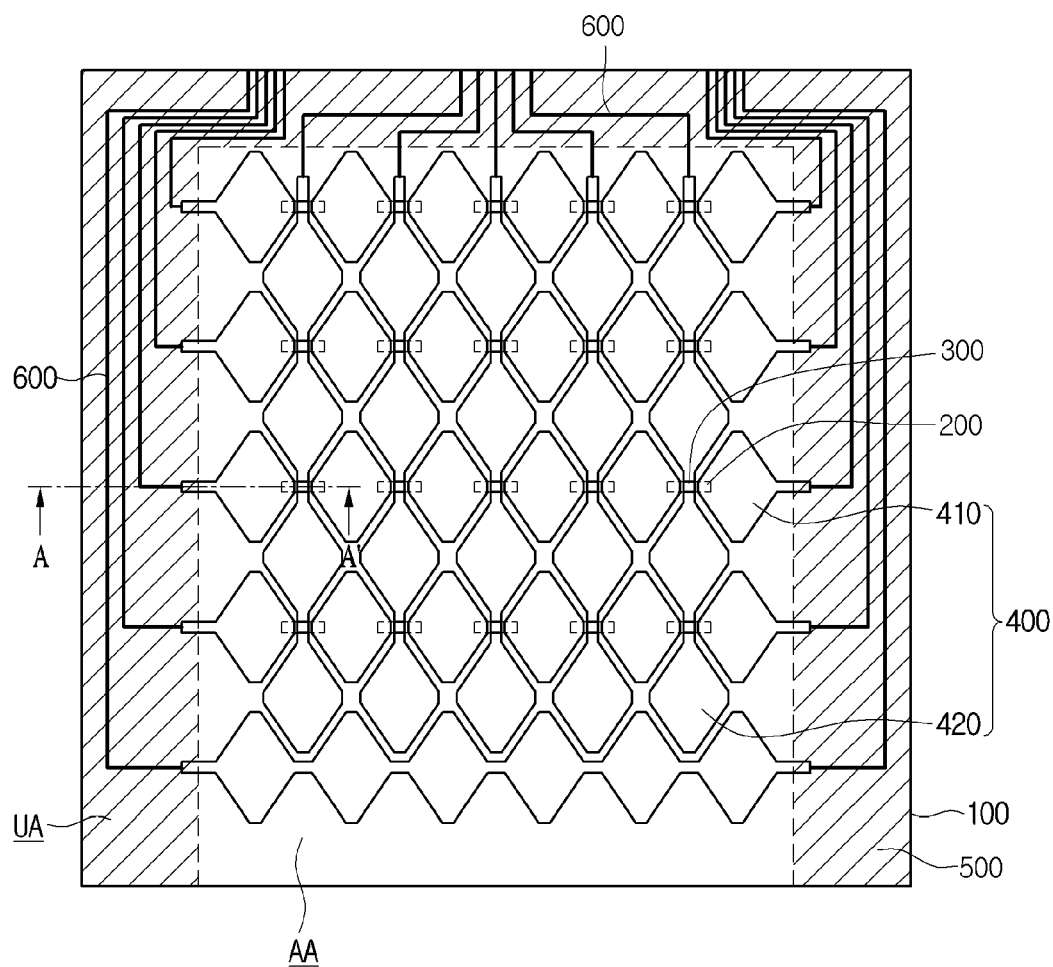
FIG. 2 is a plan view showing a touch panel according to the first embodiment.
Figure 3:
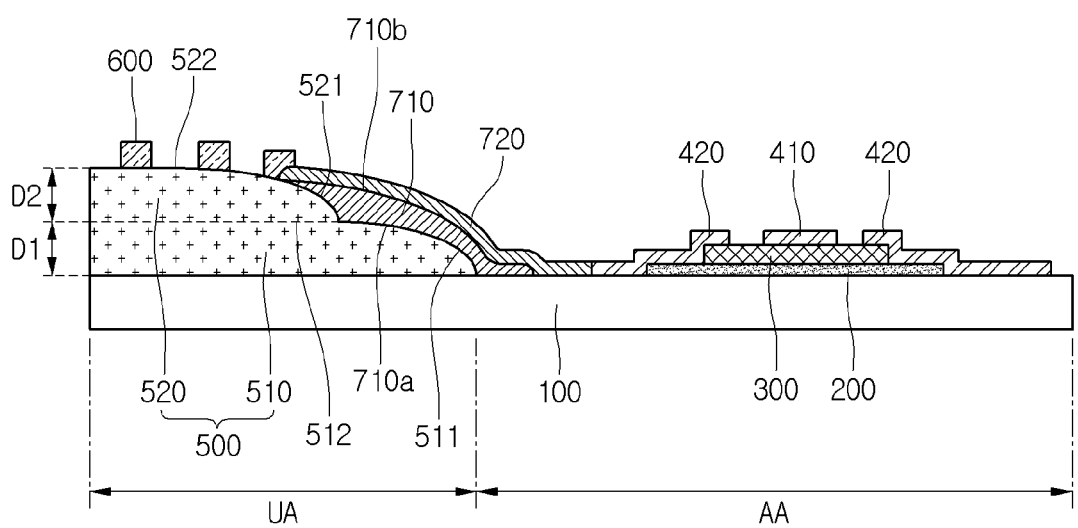
FIG. 3 is a sectional view taken along line A-A' of FIG. 2.

Referring to FIGS. 2 and 3, the touch panel according to the first embodiment includes an insulating material 300 provided on the bridge electrode 200. In detail, the insulating material 300 may be partially formed on the bridge electrode 200, so that a part of the bridge electrode 200 may be covered with the insulating material 300. For example, when the bridge electrode 200 is formed in a bar shape, the insulating material 300 may be formed on the bridge electrode 200 except for one end and the opposite end of the bridge electrode 200, that is, both ends of the bridge electrode 200.

Figure 4:
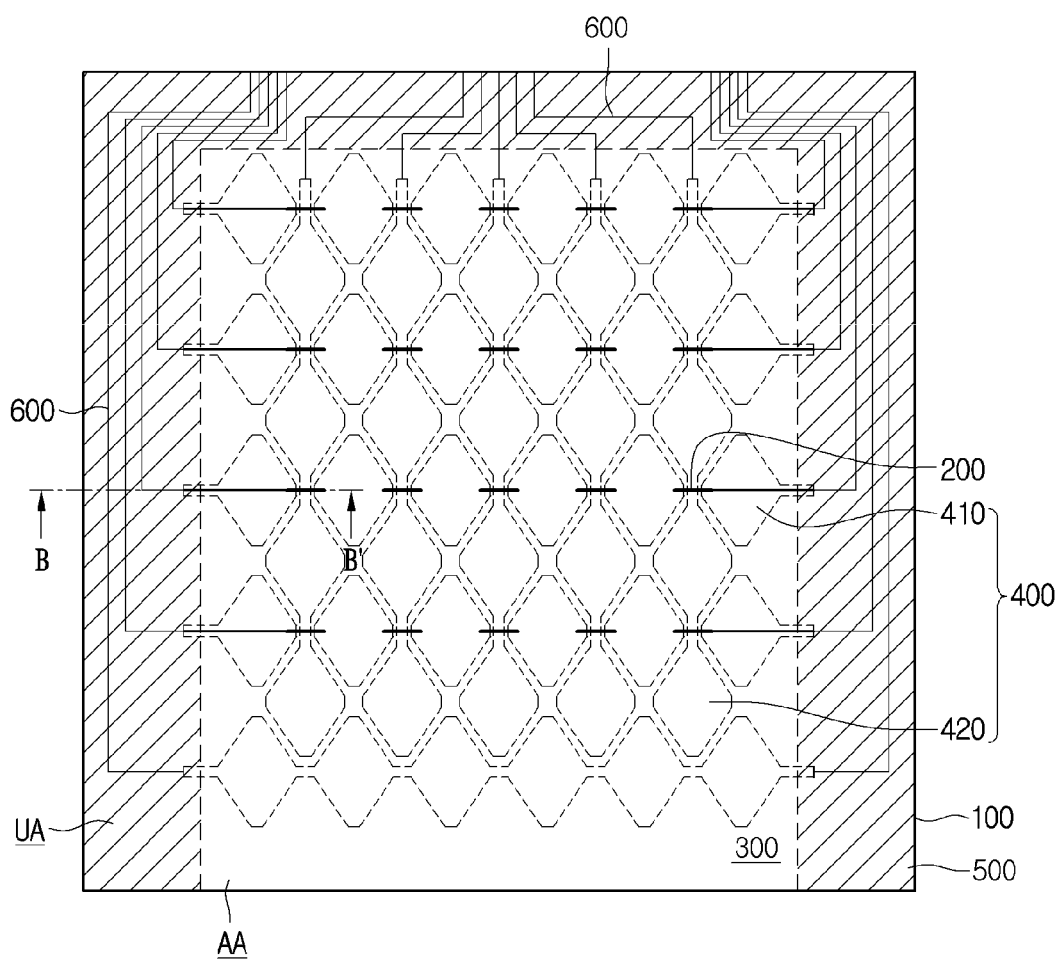
FIG. 4 is a plan view showing a touch panel according to the second embodiment.
Figure 5:
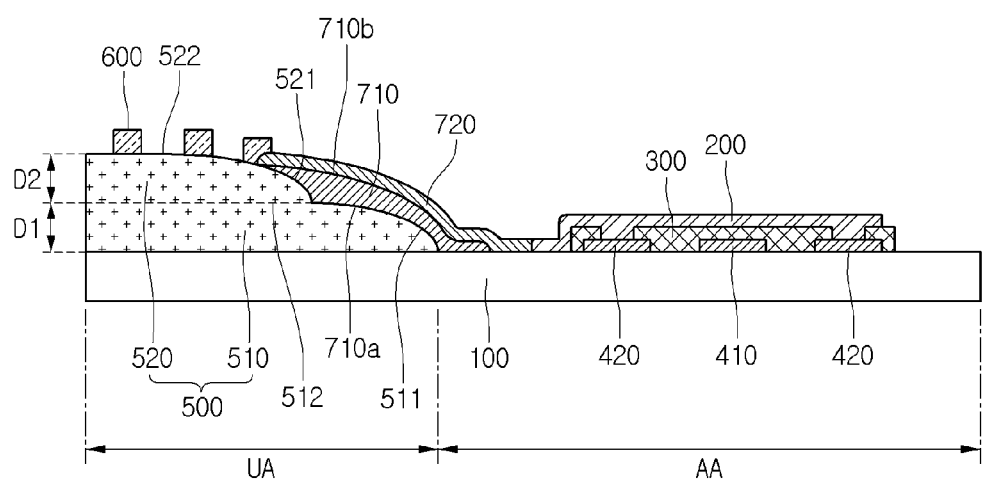
FIG. 5 is a sectional view taken along line B-B' of FIG. 4.

In addition, referring to FIGS. 4 and 5, according to the touch panel of the second embodiment, the sensing electrode 400 may be provided on one surface of the cover substrate, the insulating material 300 may be provided on the sensing electrode 400 and the bridge electrode 200 may be provided on the insulating material 300. A through-hole connected to the sensing electrode 400 may be formed in the insulating material 300, so that the bridge electrode 200 and the sensing electrode 400 may be electrically connected to each other through the through-hole. The sensing electrode 400 may be provided on the active area AA. The sensing electrode 400 disposed on the active area AA may perform a sensor function of sensing a touch. In detail, a first sensing electrode 410 extending in one direction and a second sensing electrode 420 extending in another direction may be formed on the active area AA.

Referring to FIGS. 2 and 3, according to the touch panel of the first embodiment, the first and second sensing electrodes 410 and 420 may be provided on the insulating material 300. At least one of the first and second sensing electrodes 410 and 420 may be connected to both ends of the bridge electrode 200.

In detail, the first sensing electrodes 410 may be provided on the insulating material 300 and may be electrically connected to each other through a connecting part. In addition, the second sensing electrodes 420 may be connected to both ends of the bridge electrode 200 so that the second sensing electrodes 420 may be electrically connected to each other. Thus, the first and second sensing electrodes 410 and 420 may be electrically connected to each other without being short-circuited with each other due to the bridge electrode and the insulating material.

As shown in FIGS. 4 and 5, according to the touch panel of the first embodiment, the first and second sensing electrodes 410 and 420 may be provided on one surface of the cover substrate 100. In this case, the first sensing electrodes 410 may be connected to each other through the connecting part and the second sensing electrodes 420 may be provided while being separated from each other.

Then, after the insulating material 300 surrounding the first and second sensing electrodes 410 and 420 is provided and through-holes are formed at positions of the insulating material 300 corresponding to those of the second sensing electrodes 420, the bridge electrode 200 is provided on the insulating material 300 so that the second sensing electrodes 420 may be electrically connected to each other through the bridge electrode 200. Thus, the first and second sensing electrodes 410 and 420 may be electrically connected to each other without being short-circuited with each other due to the bridge electrode and the insulating material.

The printing layer 500 and the wire electrode 600 may be provided in the inactive area UA of the cover substrate.

The printing layer 500 may extend along a periphery of the cover substrate 100. The printing layer 500 may be provided by coating black or white ink according to a desired appearance. The printing layer 500 prevents the wire electrode described below from being seen from an outside. In addition, a pattern may be formed on the printing layer 500 to form a desired logo.

The printing layer 500 may be formed in at least one layer. For example, the printing layer 500 may include first and second printing layers 510 and 520.

The first printing layer 510 may be provided on a top surface of the cover substrate 100. In addition, the second printing layer 520 may be provided on a top surface of the first printing layer 520. The first printing layer 510 may have a width different from that of the second printing layer 520. In detail, the first printing layer 510 may have a width wider than that of the second printing layer 520. The first and second printing layers 510 and 520 may have thicknesses in the range of about 6 µm to about 8 µm, respectively. When the thicknesses of the first and second printing layers 510 and 520 is less than about 6 µm, the electrode provided on the printing layer may be visually recognized. When the thicknesses of the first and second printing layers 510 and 520 exceed about 8 µm, the entire thickness of the touch panel may be thickened due to the thickness of the printing layer.

However, the embodiment is not limited to above, but third and fourth printing layers may be further formed on the second printing layer. In the description below, the printing layer having two layers will be mainly described, and in addition, the configuration applied to this embodiment may be applicable to another embodiment in the same manner.

The cover substrate 100 and the first printing layer 510 may have a step difference. In detail, referring to FIGS. 3 and 5, a first step difference part D1 may be formed as much as the thickness of the first printing layer 510. In addition, since the first and second printing layers 510 and 520 have mutually different widths, a second step difference part D2 may be formed to have a height equal to the thickness of the second printing layer 520. Thus, the side surface 511 of the first printing layer 510 and the side surface 521 of the second printing layer 520 may be exposed. In this case, the top surface 512 of the first printing layer 510 may have a width in the range of about 0.4 mm to about 0.8 mm. Due to the characteristics of process, it may be difficult to form the first print layer to have the top surface having a width less than about 4 mm. When the top surface of the first printing layer is formed to have a width greater than 0.8 mm, the bezel area, that is, the inactive area of the touch panel may be widened so that the display area may be reduced.

That is, according to the touch panel, the first step difference part D1 may be equal to the height of the side surface of the first printing layer 510 due to the height difference between the top surface of the cover substrate 100 and the first printing layer 510. The second step difference part D2 may be equal to the height of the side surface of the second printing layer 520 due to the width difference between the first and second printing layers 510 and 520. The height of the first step difference part D1 may be equal to that of the second step difference part D2. For example, the first and second step difference parts D1 and D2 may have heights in the range of about 6 μm to about 8 μm.

Referring to FIGS. 2 to 5, a conductive layer may be provided on the first printing layer 510. In detail, first and second conductive layers 710 and 720 may be provided on the first printing layer 510.

The first and second conductive layers 710 and 720 may extend along the side and top surfaces of the printing layer. In detail, the first conductive layer 710 may extend from the side surface 511 of the first printing layer 510 along the top surface 512 of the first printing layer 510. In addition, the second conductive layer 720 may extend along an outer surface of the first conductive layer 710. The outer surface of the first conductive layer 710 may signify the surface 710b opposite to the surface 710a making contact with the printing layer 500 of the both surfaces 710a and 710b of the conductive layer 710 provided on the printing layer 500. That is, the first and second conductive layers 710 and 720 may be provided on the second step difference part D2 formed by the first and second printing layers.

According to the touch panel of the first embodiment, the first conductive layer 710 may include a material equal to that of the bridge electrode 200 provided on the active area AA. In addition, the first conductive layer 710 may be formed simultaneously with the bridge electrode 200.

In detail, referring to FIGS. 2 and 3, when the bridge electrode 200 is formed on the active area AA, the first conductive layer 710 may be formed on the printing layer 500 provided on the inactive area UA.

In addition, the second conductive layer 720 may include a material equal to that of the sensing electrode 400 provided on the active area AA. Further, the second conductive layer 720 may be formed simultaneously with the sensing electrode 400.

In detail, when the sensing electrode 400 is formed on the active area AA, the second conductive layer 720 may be formed on the printing layer 500 provided on the inactive area UA. In detail, the second conductive layer 720 may be provided on the printing layer 500 while extending along the outer surface of the first conductive layer 710. The second conductive layer 720 may be formed integrally with the sensing electrode 400. In detail, the second conductive layer 720 may be a connecting part of the sensing electrode 400.

In addition, according to the touch panel of the second embodiment, as shown in FIGS. 4 and 5, when the sensing electrode 400 is formed on the active area AA, the first conductive layer 710 may be formed on the side and top surfaces of the printing layer provided on the inactive area UA.

In addition, the second conductive layer 720 may include a material equal to that of the bridge electrode 200 provided on the active area AA. Further, the second conductive layer 720 may be formed simultaneously with the bridge electrode 200 when the bridge electrode 200 is formed.

In detail, when the bridge electrode 200 is formed, the second conductive layer 720 may be formed along the outer surface of the first conductive layer 710 provided on the inactive area UA together with the bridge electrode 200. In more detail, the second conductive layer 720 may be provided on the side and top surfaces of the printing layer while extending along the outer surface of the first conductive layer 710. The second conductive layer 720 may be formed integrally with the bridge electrode 200.

Thus, two conductive layers or more, that is, the first and second conductive layers 710 and 720, which are provided while filling the step difference parts of the first and second printing layers, may be provided on the printing layer.

Thus, the second conductive layer 720 may prevent crack from being generated by the first step difference part D1. That is, the height of the first step difference part D1 may be reduced corresponding to the height of the first conductive layer 710, so that the second conductive layer 720 may be prevented from being open circuited due to crack of the second conductive layer 720 caused by the step difference when extending to the top surface 512 through the side surface of the first printing layer 510.

The wire electrode 600 may be provided on the printing layer 500. The wire electrode 600 may be formed of various materials through which an electric signal may be applied to the first and second sensing electrodes 410 and 420. The wire electrode 600 may include a material having excellent electrical conductivity such as a metal.

The wire electrode 600 may be provided on the printing layer 500. In detail, the wire electrode 600 may be provided on the printing layer 500 and may make contact with the second conductive layer 720. In more detail, the wire electrode 600 may be provided on the second conductive layer 720.

That is, the wire electrode 600 may be provided on the second conductive layer 720, and the wire electrode 600 may make direct contact with the second printing layer 520 and may be disposed on the second printed layer 520.

In addition, the wire electrode 600 may include a material different from that of at least one of the first and second conductive layers 710 and 720.

A pad part (not shown), which connects the wire electrode 600 to the conductive layer, may be provided on the printing layer 500. An external circuit including a printed circuit board on which a driving chip is mounted may be connected to the pad part.

Thus, the electrical signals applied from the sensing electrodes may be transmitted to the driving chip mounted on the printed circuit board connected to the wire electrode through the wire electrode.

As described above, the printing layer formed on the inactive area of the cover substrate may have a step difference and may be formed in two layers or more. Thus, due to the step difference between the printing layer and the cover substrate, crack may be generated in the first conductive layer when the part, that is, the second conductive layer at which the wire electrode and the sensing electrode are connected to each other, extends from the side surface of the first printing layer toward the top surface of the first printing layer, so that the first conductive layer may be open circuited.

In addition, due to the step difference between the printing layers, crack may be generated at the interface of the first and second printing layers in the wire electrode, so that the wire electrode may be open circuited.

Thus, according to the touch panel of the first embodiment, in order to compensate for such a structural weakness, the conductive layer for compensating for the step difference is formed on the printing layer.

That is, according to the touch panel of the first embodiment, the first conductive layer is provided on the first and second step difference parts generated between the first and second printing layers. The second conductive layer is provided on the outer surface of the first conductive layer. Thus, the conductive layer disposed on the first printing layer may be formed in two layers or more.

Therefore, the height of the step difference, that is, the first step difference part of the first printing layer and the cover substrate may be reduced to be equal to the height of the first conductive layer. Even if the crack is generated in the first or second conductive layer, an electric signal is enabled to be transmitted through another conductive layer, so that an open circuit of the sensing electrode which may occur due to the first step difference part can be prevented.

In addition, the height of the second step difference part formed by the first and second printing layers can be reduced to be equal to the height of the conductive layer by forming the conductive layer on the first printing layer in two layers or more, so that the occurrence of the open circuit, which may be caused due to crack in the wire electrode extending from the second printing layer to the first printing layer, can be reduced.

Thus, the touch panel according to the embodiment can prevent crack from being generated in the wire electrode and the connecting part due to the step difference of the printing step, so that the reliability of the touch panel can be improved.

Hereinafter, a touch panel according to the third embodiment will be described with reference with FIGS. 1, 6 and 7. In the following description of the touch panel according to the third embodiment, the detailed descriptions about the parts similar or identical to those described in the touch panels of the first and second embodiments will be omitted in order to avoid redundancy. That is, the description about the touch window according to the third embodiment cooperates essentially with the description about the touch window according to the first and second embodiments.

Figure 6:
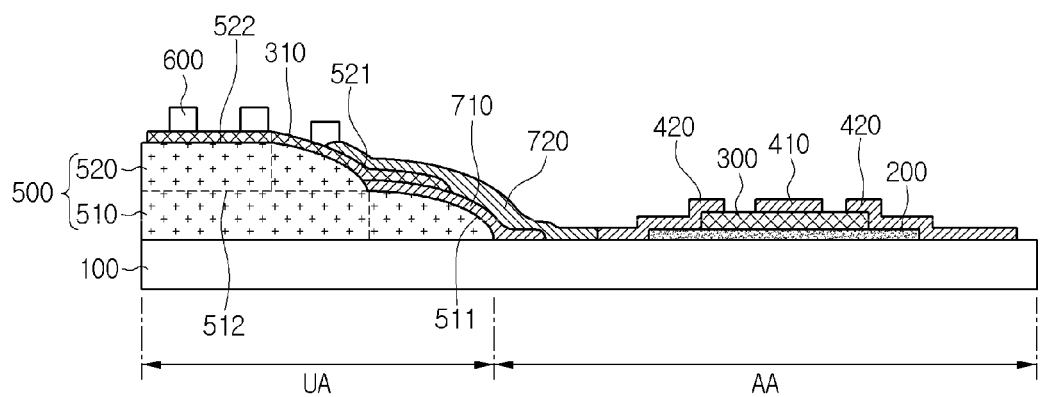
FIG. 6 is a sectional view showing a touch panel according to the third embodiment.
Figure 7:
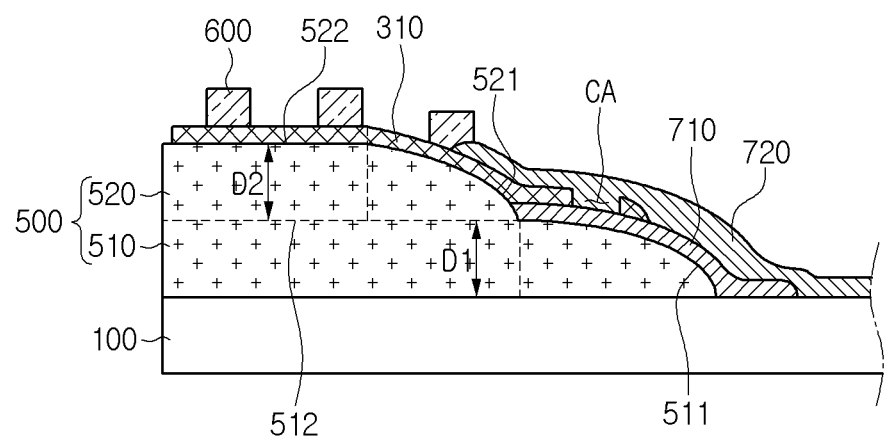
FIG. 7 is another sectional view showing a touch panel according to the third embodiment.

Referring to FIGS. 1, 6 and 7, the touch panel according to the second embodiment may further include an insulating layer 310 provided on the printing layer 500.

The insulating layer 310 may be provided on the first and second printing layers 510 and 520. In detail, the insulating layer 310 may be provided on the first conductive layer 710 and the second conductive layer 720 may be provided on the insulating layer 310. That is, the insulating layer 310 may be interposed between the first and second conductive layers 710 and 720. That is, the first conductive layer 710, the insulating layer 310 and the second conductive layer 720 may be provided in turn on the first printing layer 510, and the insulating layer 310 may be provided on the second printing layer 520.

That is, the first conductive layer 710 may be provided on the first printing layer 510. The insulating layer 310 including an open area through which the first conductive layer is exposed may be provided on the first conductive layer 710. The second conductive layer 720 electrically connected to the first conductive layer 710 through the open area may be provided on the insulating layer 310.

The insulating layer 310 may extend from the top surface 512 of the first printing layer to the top surface 522 of the second printing layer along the side surface 521 of the second printing layer.

The insulating layer 310 may include the material equal to the insulating material 300 formed on the active area AA and may be formed simultaneously with the insulating material 300. The insulating layer 310 may have a thickness in the range of about 1.5 μm to 2.5 μm.

The insulating layer 310 may be provided on the printing layer 500 so that the adhesive strength of the wire electrode 600 provided on the printing layer 500 may be improved. That is, the wire electrode can be prevented from being damaged by the insulating layer which is capable of compensating for the high roughness of the printing layer 500 and the wire electrode 600 may have superior adhesive strength when adhering to the insulating layer 310 as compared with the printing layer 500, so that the adhesion property of the wire electrode can be improved.

In addition, the insulating layer 310 reduces the first and second step difference parts generated by the first and second printing layers 510 and 520, so that the wire electrode 600 can be prevented from being open circuited due to the crack generated in the step difference part of the first and second printing layers 510 and 520.

An open area CA may be further formed in the insulating layer 310. In detail, the open area CA may be formed in the insulating layer 310 to electrically connect the first conductive layer 710 to the second conductive layer 720. Thus, the first conductive layer 710 makes contact with the second conductive layer 720 in the open area CA so that the first conductive layer 710 may be electrically connected to the second conductive layer 720.

In addition, the insulating layer 310 is further provided on the printing layer 500, so that the insulating layer 310 can improve the visibility of the touch panel together with the printing layer.

Thus, when crack is generated in the second conductive layer 720, an electric signal such as a touch signal may be transmitted through the first conductive layer 710 via the conductive area CA, so that the electric signal may be transmitted to the wire electrode without the short circuit.

The touch panel according to the third embodiment includes a conductive material or an insulating material which compensates for the step difference on the printing layer.

Therefore, since the conductive material formed in the step difference part of the printing layer is formed in two layers or more and an insulating material is further included, the step difference generated in the first and second printing layers can be reduced, so that the wire electrode can be prevented from being open circuited due to the crack generated by the step difference.

In addition, a part connecting the wire electrode to the sensing electrode is formed in two layers or more and a conductive area is formed in the insulating part, so that a signal is enabled to be transmitted through one layer even if the other layer is open circuited. Therefore, a problem of signal interruption caused by the short circuit of the electrode due to the step difference can be solved.

Therefore, according to the touch panel of the third embodiment, cracks of the wire electrode and the connecting part generated due to the step difference of the printing layer can be prevented, so that the reliability of the touch panel can be improved.

As described above, although the sensing electrode provided on the cover substrate is depicted, the embodiment is not limited thereto. According to the touch panel of the fourth embodiment, the sensing electrode can be provided on the substrate disposed on the cover substrate.

Figure 8:
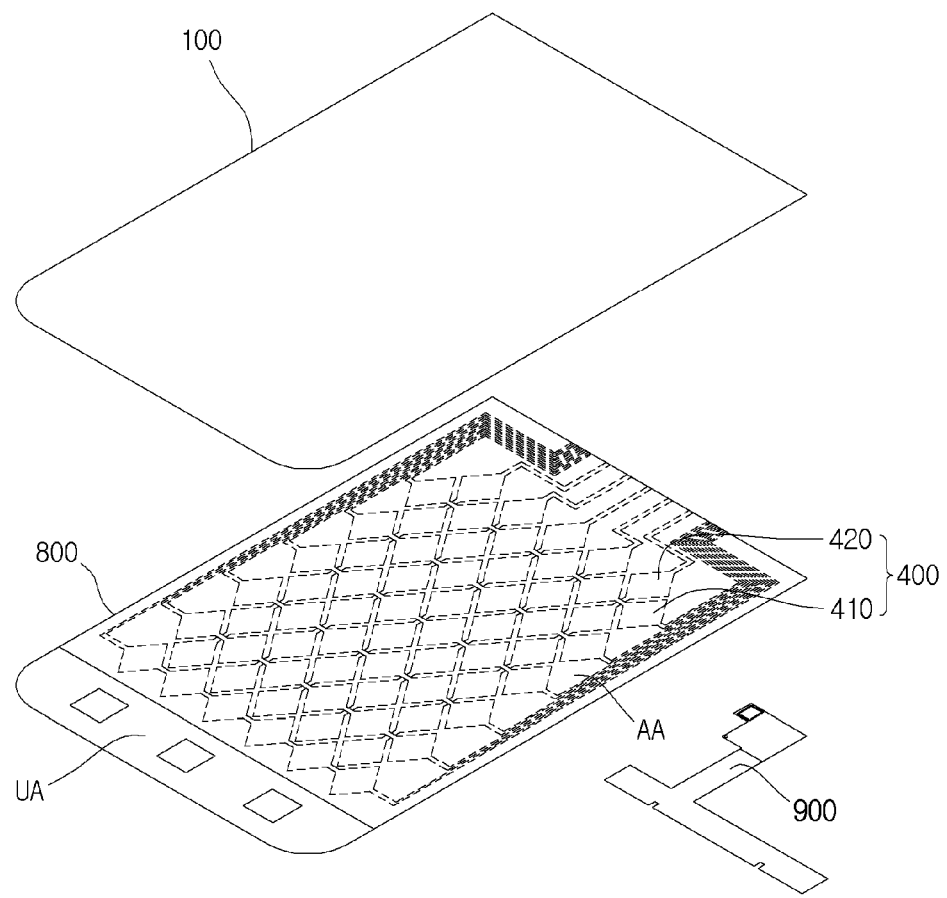
FIG. 8 is a perspective view showing a touch panel according to the fourth embodiment.

Referring to FIG. 8, a substrate 800 is provided on the cover substrate 100. The first sensing electrode 410, the second sensing electrode 420, the bridge electrode 200, the first conductive layer 710, the second conductive layer 720 and the insulating layer 310 may be provided on the substrate 800. The substrate 800 may include plastic such as polyethylene terephthalate (PET).

The first sensing electrode 410, the second sensing electrode 420, the bridge electrode 200, the first conductive layer 710, the second conductive layer 720 and the insulating layer 210 have the same connection scheme as those of the first to third embodiments described above, and the details will be omitted.

Figure 9:
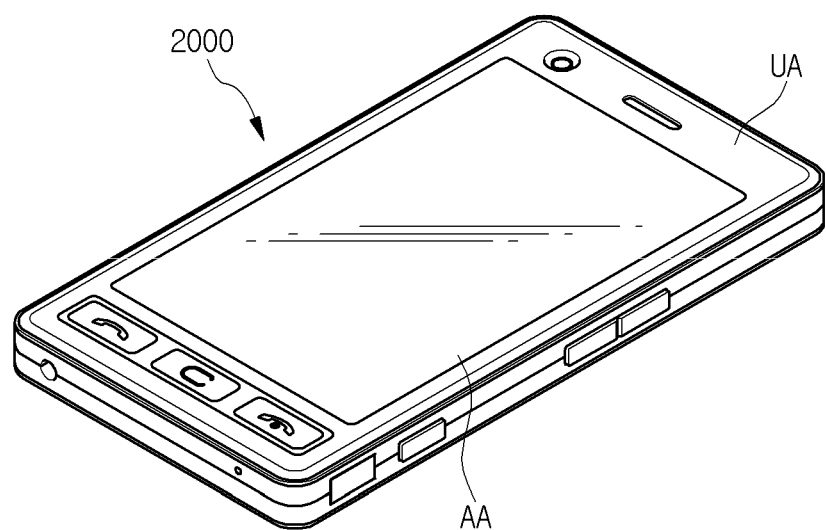
FIG. 9 is a view showing one example of a display to which a touch panel according to the first to fourth embodiments is applied.

FIG. 9 is a view showing a mobile terminal including the touch panel described above.

Referring to FIG. 9, the mobile terminal 2000 may include an active area AA and an inactive area UA. A touch signal by a finger may be sensed through the active area AA, and an instruction icon pattern and a log may be formed in the inactive area UA.

Although the mobile terminal is shown in FIG. 9 as examples, it should be understood that the electrode members and touch panels described above may be applied to various electric appliances, such as vehicles or electric home appliances equipped with displays as well as the mobile terminal.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch panel comprising:
   a cover substrate including an active area and an inactive area;
   sensing electrodes including first sensing electrodes and second sensing electrodes on the active area, the first sensing electrodes being insulated from the second sensing electrodes;
   a bridge electrode connecting with the first or the second sensing electrodes on the active area;
   a first printing layer on the inactive area;
   a second printing layer on the first printing layer;
   a wire electrode on the second printing layer;
   a conductive layer connecting the sensing electrodes with the wire electrode, the conductive layer being on the first printing layer;
   the conductive layer including a first conductive layer and a second conductive layer; and
   an insulating layer interposed between the first and second conductive layers on the inactive area;
   wherein the second printing layer has a width smaller than a width of the first printing layer,
   wherein the first and second conductive layers extend along a side surface of the first printing layer to a top surface of the first printing layer,
   wherein the second conductive layer extends to a side surface of the second printing layer,
   wherein the first conductive layer is in direct physical contact with the side surface of the first printing layer and the side surface of the second printing layer, and extends continuously from the side surface of the first printing layer to the side surface of the second printing layer;
   wherein the wire electrode makes contact with the second conductive layer,
   wherein the second conductive layer is electrically connected to the bridge electrode, the first sensing electrode, or the second sensing electrode,
   wherein the insulating layer includes an open area through which the first conductive layer is electrically connected to the second conductive layer, and
   wherein the first conductive layer makes contact with the second conductive layer through the open area.

2. The touch panel of claim 1, wherein the second conductive layer extends along an outer surface of the first conductive layer.

3. The touch panel of claim 1,
   wherein the first and second sensing electrodes are provided on a same plane with the cover substrate.

4. The touch panel of claim 1,
   wherein the first conductive layer includes a material that is same as a material of the bridge electrode.

5. The touch panel of claim 1, wherein the second conductive layer serves as an extension part of the second sensing electrode.

6. The touch panel of claim 1, wherein the first conductive layer includes a material that is same as a material of at least one of the first and second sensing electrodes; and
   the second conductive layer includes a material that is same as a material of the bridge electrode.

7. The touch panel of claim 1, wherein the insulating layer extends from a top surface of the first printing layer and along a side surface and a top surface of the second printing layer.

8. The touch panel of claim 1, further comprising:
   an insulating material disposed on the bridge electrode; and
   wherein the first and second sensing electrodes are provided on the insulating material, and
   wherein the first and second sensing electrodes are provided on a same plane with the cover substrate.

9. The touch panel of claim 8, wherein the first conductive layer includes a material that is same as a material of the bridge electrode, the second conductive layer includes a material that is same as a material of at least one of the first and second sensing electrodes; and the insulating layer includes a material that is same as a material of the insulating material.

10. The touch panel of claim 1, further comprising:

an insulating material on the first and second sensing electrodes;

wherein the bridge electrode is disposed on the insulating material, wherein the first and second sensing electrodes are provided on a same plane with the cover substrate, wherein the first conductive layer includes a material same as that of at least one of the first and second sensing electrodes, wherein the second conductive layer includes a material same as that of the bridge electrode, and wherein the insulating layer includes a material same as that of the insulating material.

11. The touch panel of claim 1, wherein the wire electrode includes a material different from a material of at least one of the first and second conductive layers.

12. The touch panel of claim 1, wherein the second conductive layer is simultaneously formed with at least one of the first and second sensing electrodes.

13. The touch panel of claim 1, wherein a portion of the first conductive layer is disposed under the open area filled with the second conductive layer.

14. A touch panel comprising:

a substrate including an active area and an inactive area, being configured to display an image and receive a touch input, and the inactive area being configured to function as a bezel;

sensing electrodes on the active area, the sensing electrodes including first sensing electrodes extended in a first direction and second sensing electrodes extended in a second direction different from the first direction, and the first sensing electrodes being insulated from the second sensing electrodes;

a bridge connecting with the first or second sensing electrodes on the active area;

a wire electrode on the inactive area;

a first insulating part on the inactive area; and a second insulating part on the active area, wherein the first insulating part includes an open area through which the wire electrode is electrically connected to the sensing electrodes, wherein the first insulating part and the second insulating part comprise a same material, are transparent, and are simultaneously formed; and wherein the touch panel further comprises a conductive layer disposed on, and in direct physical contact with, a side surface of a printing layer on the inactive area.

15. The touch panel of claim 14:

wherein the second insulating part is disposed between the first sensing electrodes and the second sensing electrodes.

16. The touch panel of claim 15, wherein the second insulating part has a through hole, and wherein the sensing electrodes are connected with the bridge through the through hole.

17. The touch panel of claim 14, wherein the open area has a via hole, and wherein the via hole is filled with a conductive material.

18. The touch panel of claim 14, further comprising a conductive layer connecting the sensing electrodes with the wire electrode.

19. The touch panel of claim 18, wherein the conductive layer is simultaneously formed with at least one of the first and second sensing electrodes.

* * * * *